United States Patent
Gilbert et al.

(10) Patent No.: US 9,698,609 B2
(45) Date of Patent: Jul. 4, 2017

(54) TESTING DEVICE POWER INDUCED BY CURRENT TRANSFORMER

(71) Applicant: Fluke Corporation, Everett, WA (US)

(72) Inventors: John M. Gilbert, Seattle, WA (US); Clark N. Huber, Everett, WA (US)

(73) Assignee: Fluke Corporation, Everett, WA (US)

( * ) Notice: Subject to any disclaimer, the term of this patent is extended or adjusted under 35 U.S.C. 154(b) by 180 days.

(21) Appl. No.: 14/595,576

(22) Filed: Jan. 13, 2015

(65) Prior Publication Data
US 2016/0204617 A1    Jul. 14, 2016

(51) Int. Cl.
| | |
|---|---|
| *H02J 5/00* | (2016.01) |
| *G01D 11/00* | (2006.01) |
| *G01R 1/22* | (2006.01) |
| *G01R 15/14* | (2006.01) |
| *G01R 15/18* | (2006.01) |
| *G01R 19/25* | (2006.01) |

(52) U.S. Cl.
CPC .............. *H02J 5/005* (2013.01); *G01D 11/00* (2013.01); *G01R 1/22* (2013.01); *G01R 15/14* (2013.01); *G01R 15/186* (2013.01); *G01R 19/2513* (2013.01)

(58) Field of Classification Search
CPC ...... G01D 11/00; G01R 15/14; G01R 15/186; G01R 19/2513; G01R 1/22; H02J 5/005
See application file for complete search history.

(56) References Cited

U.S. PATENT DOCUMENTS

| | | | |
|---|---|---|---|
| 7,750,621 B1 | 7/2010 | Liu | |
| 2006/0202664 A1* | 9/2006 | Lindsey | .................. H02J 5/005 320/137 |
| 2007/0007968 A1 | 1/2007 | Mauney, Jr. et al. | |
| 2009/0015239 A1* | 1/2009 | Georgiou | ............... G01R 15/14 324/105 |
| 2010/0085036 A1 | 4/2010 | Banting et al. | |
| 2010/0231198 A1* | 9/2010 | Bose | .................... G01R 15/207 324/117 H |
| 2010/0253318 A1 | 10/2010 | Thomas, Sr. | |

(Continued)

FOREIGN PATENT DOCUMENTS

CA    2 874 908 A1    12/2013

OTHER PUBLICATIONS

Extended European Search Report, dated Jun. 17, 2016, for European Application No. 16151112.6-1568, 7 pages.
Fluke, "1730 Energy Logger" Users Manual, Sep. 2013, 70 pages.

*Primary Examiner* — Francis Gray
(74) *Attorney, Agent, or Firm* — Seed IP Law Group LLP

(57) ABSTRACT

A system includes a testing device, a current clamp, and circuitry for converting an electrical current. The testing device is configured to measure a characteristic relating to electrical equipment and to transmit data representing the measured characteristic to a remote computing device. The electrical equipment includes an electrical conductor carrying an electric current. The current clamp forms a current transformer. The current clamp is configured to be clamped around the electrical conductor and the current transformer is configured to induce an electric current from the electrical conductor. The circuitry is configured to convert the induced electric current to a direct current that is usable to power the testing device.

24 Claims, 9 Drawing Sheets

(56) References Cited

U.S. PATENT DOCUMENTS

| | | | |
|---|---|---|---|
| 2011/0012589 A1* | 1/2011 | Greenberg | G01R 15/12 324/127 |
| 2011/0172938 A1 | 7/2011 | Gu et al. | |
| 2012/0013292 A1 | 1/2012 | Ali et al. | |
| 2012/0306434 A1 | 12/2012 | Sassen et al. | |
| 2014/0145858 A1* | 5/2014 | Miller | G08C 17/02 340/870.07 |
| 2014/0176155 A1* | 6/2014 | Davis | A46B 9/028 324/543 |
| 2016/0084879 A1* | 3/2016 | Luo | G01R 1/0416 324/127 |

* cited by examiner

TESTING DEVICE POWER INDUCED BY CURRENT TRANSFORMER

BACKGROUND

Various testing devices are used to measure parameters of electrical equipment areas. For example, sensors can detect electrical characteristics of the electrical equipment, such as voltage, current, resistance, and the like. Sensors can also detect environmental characteristics of the electrical equipment area or the surrounding area, such as temperature, pressure, humidity, and the like. Data obtained from the testing devices can be used to evaluate performance of the electrical equipment, potential dangers to the electrical equipment, needed adjustments or maintenance of the electrical equipment, and the like.

Some electrical equipment areas can be difficult to access. For example, electrical equipment areas can be enclosed and accessible only via one or more panels. Such panels can be large, sometimes requiring more than one person to open, and opening such panels can take a significant amount of time and energy. Electrical equipment areas can also be dangerous, such as in the case of electrical equipment areas that contain high energy circuits. Persons entering such areas may need to use personal protective equipment that has high electric resistivity for protection from electric shock. Such personal protective equipment can include special clothing, gloves, footwear, headwear, and the like. However, the use of personal protective equipment can be slow and cumbersome, adding to the time and cost of entering electrical equipment areas. Safety concerns may also necessitate shutting down some or all of the electrical equipment when people enter electrical equipment areas, resulting in loss of service by the electrical equipment while people are accessing the area.

Because entering electrical equipment areas can incur time, labor, and operational costs, and risk of personal safety, reducing the number of times that entry into electrical equipment areas is desirable. In addition, ongoing monitoring by testing devices may also be desirable, especially in the case of continuously operating electrical equipment.

SUMMARY

The following summary is provided to introduce a selection of concepts in a simplified form that are further described below in the Detailed Description. This summary is not intended to identify key features of the claimed subject matter, nor is it intended to be used as an aid in determining the scope of the claimed subject matter.

At least in one embodiment disclosed herein, a system includes a testing device, a current clamp, and circuitry for conversion of electrical current. The testing device is configured to measure a characteristic relating to electrical equipment and to transmit data representing the measured characteristic to a remote computing device. The electrical equipment includes an electrical conductor carrying an electric current. The current clamp forms a current transformer. The current clamp is configured to be clamped around the electrical conductor and the current transformer is configured to induce an electric current from the electrical conductor. The circuitry is configured to convert the induced electric current to a direct current that is usable to power the testing device.

In one embodiment, the system also includes a sensor configured to produce a signal based on the characteristic of the electrical equipment. The characteristic can be an electrical characteristic of at least a portion of the electrical equipment. In one example, the portion of the electrical equipment includes the electrical conductor. In another example, the portion of the electrical equipment does not include the electrical conductor. The characteristic can also be an environmental characteristic of the electrical equipment or an area holding the electrical equipment. In one example, the sensor is external to and coupled to the testing device. In another example, the sensor is internal to the testing device.

In another embodiment, the testing device includes one or more batteries. The circuitry can be configured to provide power to the testing device from one of the direct current and the one or more batteries based on a voltage of the direct current and a voltage of the one or more batteries. The circuitry can also include diodes arranged to provide power to the testing device from one of the direct current and the one or more batteries based on the higher of the voltage of the direct current and the voltage of the one or more batteries. The testing device can include a battery compartment configured to hold the one or more batteries and a battery compartment cover. The battery compartment cover can include a connector configured to electrically couple the current clamp to the testing device. At least a portion of the circuitry can be located on the battery compartment cover. The circuitry can be configured to recharge the one or more batteries using the direct current. In one example, the circuitry is configured to simultaneously recharge the one or more batteries and power the testing device using the direct current.

In another embodiment, the system includes an indicator configured to indicate whether the current clamp is inducing an electric current from the electrical conductor. The indicator can include at least one of a light on the current clamp, a light on the testing device, or an icon on a display of the testing device. In another embodiment, a size of the current clamp is determined based on a size of the electrical conductor. In another embodiment, the electric current induced from the electrical conductor is equal to or less than 1% of the electric current carried by the electrical conductor. In another embodiment, the electric current carried by the electrical conductor is greater than a maximum current rating of the testing device. In another embodiment, the testing device is further configured to transmit the data representing the measured characteristic to the remote computing device via at least a wireless signal. In another embodiment, the current transformer is a non-torroidal current transformer.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The following detailed description refers to the accompanying drawings. The illustrative embodiments described in the detailed description, the accompanying drawings and the claims are not limiting, and other embodiments may be adopted, or modifications may be made without deviating from the spirit and subject of the application. It should be understood that the various aspects of the application described and graphically presented herein may be arranged, replaced, combined, divided and designed in many different configurations, and these different configurations are implicitly included in the application.

In the following paragraphs, specific terms may be used to clearly describe the illustrative embodiments. However, the intent of using specific terms is not to limit the scope of protection of the claimed invention as the scope of these terms should extend to any equivalent replacements that achieve substantially the same objective in substantially the same way.

Figure 1A:
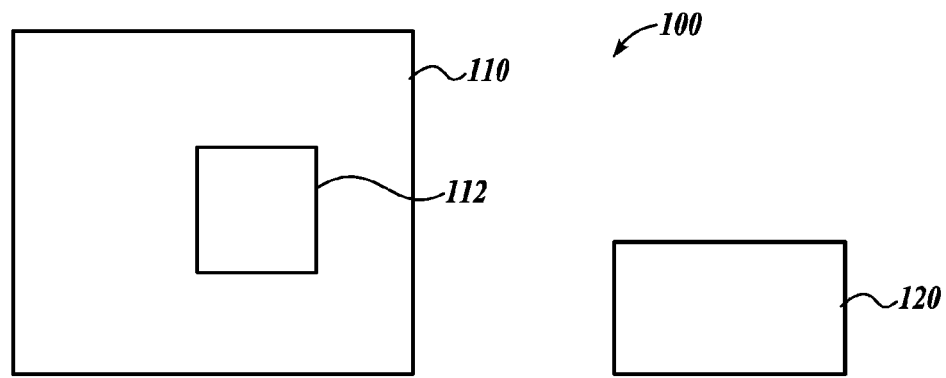
FIGS. 1A and 1B depict an example of a system with an electrical equipment area and a monitoring station.
Figure 1B:
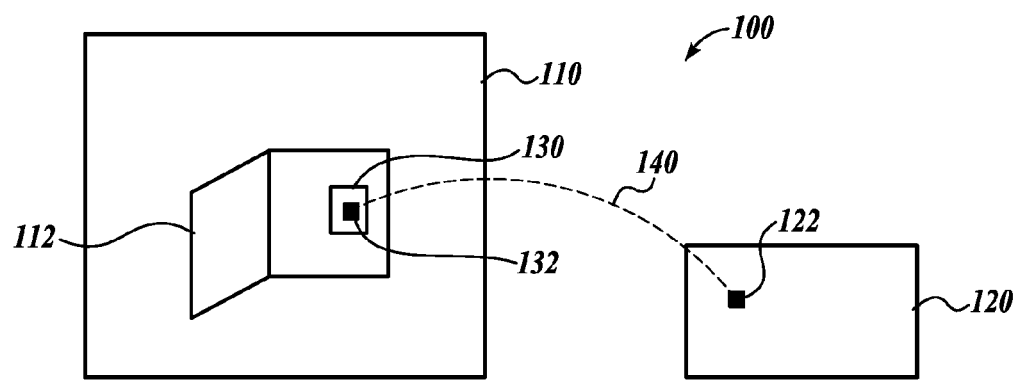

FIGS. 1A and 1B depict an example of a system 100 that includes an electrical equipment area 110 and a monitoring station 120. In some examples, the electrical equipment area 110 can be an enclosure, such as an electrical panel or a Faraday room or cage, a restricted area, such as a fenced-in electrical substation, or any other type of area that can contain or hold electrical equipment. Although not depicted in FIGS. 1A and 1B, the electrical equipment may include electrical components, such as electrical wires, transformers, capacitors, circuit breakers, switches, voltage regulators, and the like. The electrical equipment may also include non-electrical components that support electrical components, such as support structures, towers, fences, poles, conduits, and the like.

The monitoring station 120 may include a computing device, such as computer or a server, and can be used to monitor conditions within the electrical equipment area 110. The monitoring station 120 is located remotely from the electrical equipment area 110. For example, the monitoring station 120 can be located a distance away from the electrical equipment area 110 such that a person can interact with the monitoring station 120 without needing to take special precaution from risks associated with the electrical equipment area 110 (e.g., without needing to wear personal protective equipment).

The electrical equipment area 110 includes a panel 112 that can be opened or removed to gain access to an interior of the electrical equipment area 110. The panel 112 can be hinged and swing open, as is depicted in FIG. 1B, or the panel 112 can be completely removable from the electrical equipment area 110. In one example, the panel 112 may be large enough that it can be opened only by more than one person.

As shown in FIG. 1B, a testing device 130 can be placed in the electrical equipment area 110. The testing device 130 is capable of measuring a characteristic relating to electrical equipment, including the area 110 holding the electrical equipment. Characteristics that can be measured include electrical characteristics (e.g., voltages in electrical components, current in electrical components, magnetic fields generated by electrical components, and the like), environmental characteristics (e.g., temperature within the area 110, pressure within the area 110, relative humidity within the area 110, temperature of components of the electrical equipment, and the like), or any other characteristic relating to the area 110 or the electrical equipment within the area 110. The testing device 130 can receive data relating to the characteristic of the electrical equipment in the area 110 using one or more sensors. A sensor can be an external sensor that is external to and coupled to the testing device 130. A sensor can also be an internal sensor within the testing device 130.

In some embodiments, the testing device 130 is also capable of transmitting the measured data to the monitoring station 120 via a transmission 140. In one example, the testing device 130 can log the measured characteristics for a time and transmit the logged characteristics to the monitoring station 120. In another example, the testing device 130 can transmit the measured characteristics to the monitoring station 120 immediately upon receiving the measured characteristics without logging the measured characteristics internally within the testing device 130. The testing device 130 includes a transmitter 132 that sends the transmission 140 and the monitoring station 120 includes a receiver 122 that receives the transmission 140. In one example, the transmission 140 is a radio transmission, the transmitter 132 is a radio transmitter, and the receiver 122 is a radio receiver. In another example, one or both of the transmitter 132 and the receiver 122 is a transceiver. In another example, the transmission 140 can be aided by a repeater or other intermediary device. The transmission 140 can be wired, wireless, or some combination of both wired and wireless. For example, the transmitter 132 can send the transmission 140 via a Wi-Fi signal to a Wi-Fi base station and the Wi-Fi base station can pass the transmission 140 to the receiver 122 via a wired network connection. Any number of other combinations of wired and wireless transmissions may be possible.

The testing device 130 can be placed within the electrical equipment area 110 and left operating inside of the electrical equipment area 110 when the panel 112 is replaced. While inside of the electrical equipment area 110, the testing device 130 can measure a characteristic relating to the electrical equipment and transmit the measured characteristic to the monitoring station 120. However, the testing device 130 requires power to operate. Some operations of the testing device 130 may require more power than others (e.g., the testing device 130 may use less power when measuring data than when sending the transmission 140). Many testing devices are battery powered, particularly in the case of handheld testing devices. The testing device 130, if battery-powered, can operate for a limited time inside of the electrical equipment area 110 using power provided by the batteries.

One drawback to the use of batteries alone is that batteries store a finite amount of electrical power. For example, batteries alone may be able to power the testing device 130 for a few days or weeks, but the batteries need to be replaced when the batteries are depleted. Frequently needing to replace the batteries increases the number of times that the panel 112 needs to be opened. The cost and risk associated with opening the panel 112 and a person entering the electrical equipment area 110 is increased. Power sources that can power the testing device 130 continuously may not be available within the electrical equipment area 110. Power lines and electrical circuits within electrical equipment areas typically provide power that well exceeds the power requirements of the testing device 130 and the electrical equipment areas typically do not have standard power outlets (e.g., a 110-volt power outlet that is standard in the United States).

Most electrical equipment areas have strict operational constraints that require electrical devices to be tested and/or meet certain standards to operate within the electrical equipment areas. Open and available power outlets may also increase the hazard of electric shock in areas holding electrical equipment and thus may not be permitted.

FIGS. 2A-2D depict examples of a system 200 in accordance with the present disclosure that provides continuous power to a testing device 220 within an electrical equipment area 210. The system 200 includes a current clamp 240 and the testing device 220. The electrical equipment area 210 includes an electrical conductor 212 that carries an electric current. Many electrical equipment areas include electrical conductors that constantly carry electric current. As explained in greater detail below, the current clamp 240 can be used to induce enough current from the electrical conductor 212 to provide power to operate the testing device 220.

The current clamp 240 forms a non-torroidal current transformer 242 that can be clamped around the electrical conductor 212. In the embodiment shown, the current clamp 240 includes a handle 244 with an activation component 246. The current transformer 242 of the current clamp 240 is biased to a closed position, but can be opened by moving the activation component 246. The non-torroidal shape of the current transformer 242 allows a user to open the current transformer 242, place the current transformer 242 around the electrical conductor 212, and allow the current transformer 242 to return to the closed position around the electrical conductor 212 without needing to disconnect the electrical conductor 212 or stop the current flowing through the electrical conductor 212. This ability to quickly and easily clamp the current transformer 242 around the electrical conductor 212 reduces the amount of time required to install the testing device 220 in the electrical equipment area 210. In addition, many existing current clamps that can be used in the electrical equipment area 210 are already rated to satisfy the safety standards required by the electrical equipment area 210. Thus, no additional rating or certification of components will be required to provide a constant source of power to the testing device 220.

The current transformer 242 induces an electric current from the current flowing through the electrical conductor 212. The electric current carried by the electrical conductor 212 can be significantly higher than the current needed to power the testing device 220. Thus, the electric current induced by the current transformer 242 can be significantly lower than the electric current carried by the electrical conductor 212. For example, in at least one embodiment, the electric current induced by the current transformer 242 is equal to or less than about 1% of the electric current carried by the electrical conductor 212. In another embodiment, the electric current induced by the current transformer 242 is equal to or less than about 0.2% of the electric current carried by the electrical conductor 212. In yet another embodiment, the electric current carried by the electrical conductor 212 is at least 10 amps. The electric current induced by the current transformer 242 can be low enough that the electric current carried by the electrical conductor 212 is not significantly affected by the current transformer 242. The jaw size of the current clamp 240 and/or the step down of the current transformer 242 can be selected based on one or more of a size of the electrical conductor 212, the space available in the electrical equipment area 210, the electric current carried by the electrical conductor 212, and/or the current needed to power the testing device 220. The number of wire turns in the current transformer 242 can be selected based on an expected current carried by the electrical conductor 212, a desired current output from the current transformer 242, a size of the current clamp 240, and/or any other consideration.

If needed, the electric current induced by the current transformer 242 can be converted to direct current by circuitry (not shown in FIGS. 2A-2D) in the system 200. For example, portions of the circuitry can be located in the handle 244, in the testing device 220, along wiring 248 coupling the current clamp 240 to the testing device 220, or any combination thereof. After the electric current induced by the current transformer 242 is converted to direct current, the direct current can be used to power the testing device 220. An example of such circuitry is described below with respect to FIG. 5.

The testing device 220 may include a display 222 and one or more user interface mechanisms 224. A user of the testing device 220 can interact with the testing device 220 by providing inputs via the one or more user interface mechanisms 224 and viewing information on the display 222. The display 222 can also be a touchscreen display that can receive user inputs directly on the display 222.

The testing device 220 may also include an indicator 226 that provides an indication whether the testing device 220 is receiving power from the current clamp 240. In the embodiment shown in FIGS. 2A-2D, the indicator 226 on the testing device 220 is a light, such as a light-emitting diode (LED), that is illuminated when the testing device 220 is receiving power from the current clamp 240. In another embodiment, the handle 244 can include an indicator, such as an LED, that indicates when current is being provided from the current clamp 240 to the testing device 220. In another embodiment, an indicator can be provided on the display, such as an icon that is displayed, when the testing device 220 is receiving power from the current clamp 240.

The testing device 220 may also be coupled to a sensor 230. In some embodiments, the sensor 230 is coupled to the testing device 220 by wiring 232. The sensor 230 can produce a signal indicative of a characteristic of electrical equipment, including one or more characteristics of the area 210 holding the electrical equipment. That signal is passed to the testing device 220 and the testing device 220 measures data about the characteristic based on the signal. The testing device 220 may also transmit the measured characteristic using a transmitter (not shown).

Figure 2A:
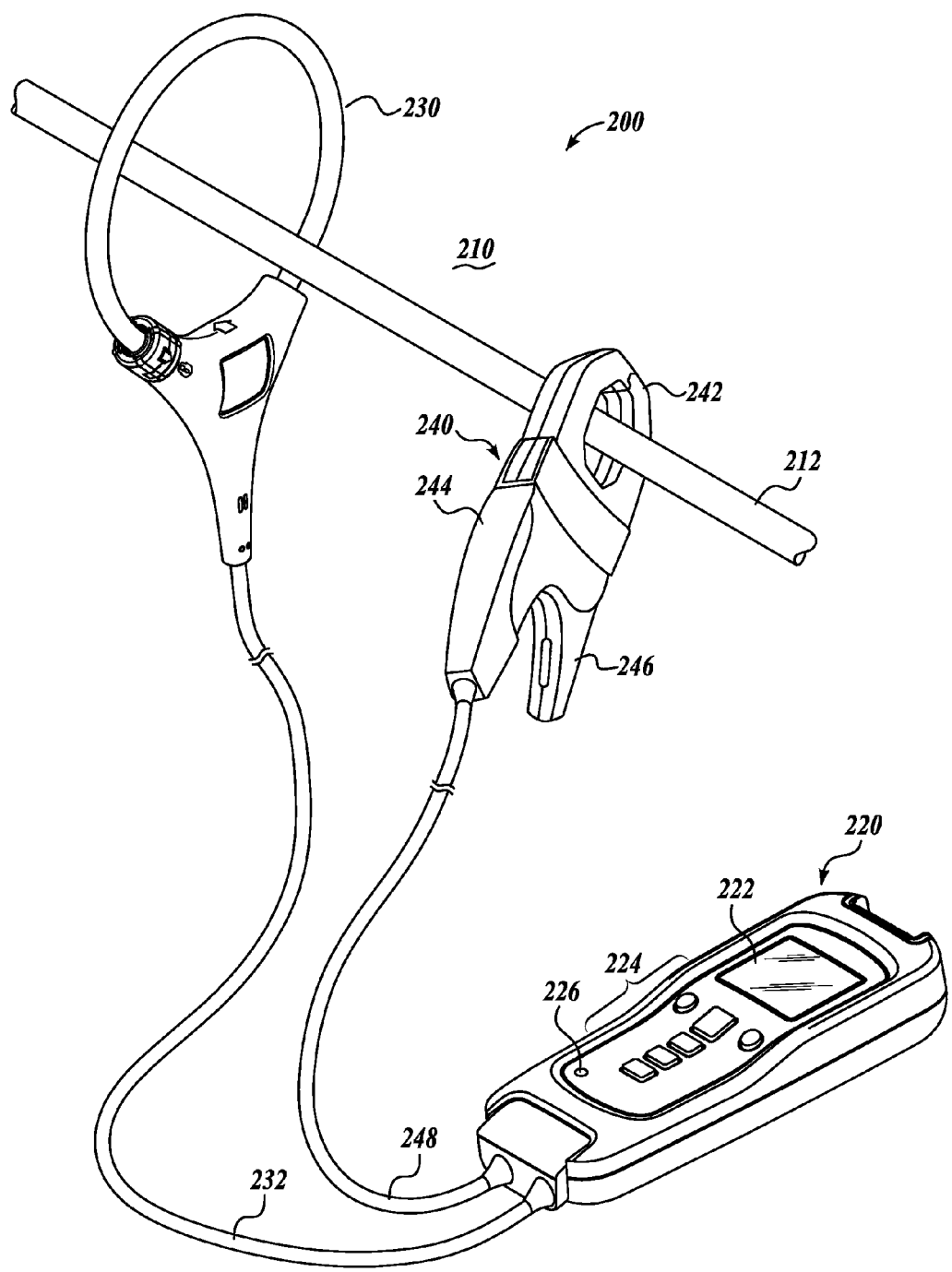
FIGS. 2A-2D depict examples of a system that provides continuous power to a testing device within an electrical equipment area.

In the embodiment depicted in FIG. 2A, the sensor 230 is external to the testing device 220. The sensor 230 is in the form of a Rogowski coil located around the electrical conductor 212. A Rogowski coil can measure electrical characteristics, such as alternating current and/or high speed current pulses in the electrical conductor 212. The sensor 230 is located around the same electrical conductor 212 from which the current clamp 240 induces a current to power the testing device 220. The electric current induced by the current transformer 242 can be low enough that the measurement by the sensor 230 is not significantly affected by the current transformer 242. For example, the amount of current induced by the current clamp 240 may be within a range of noise of the measurement by the sensor 230.

Figure 2B:
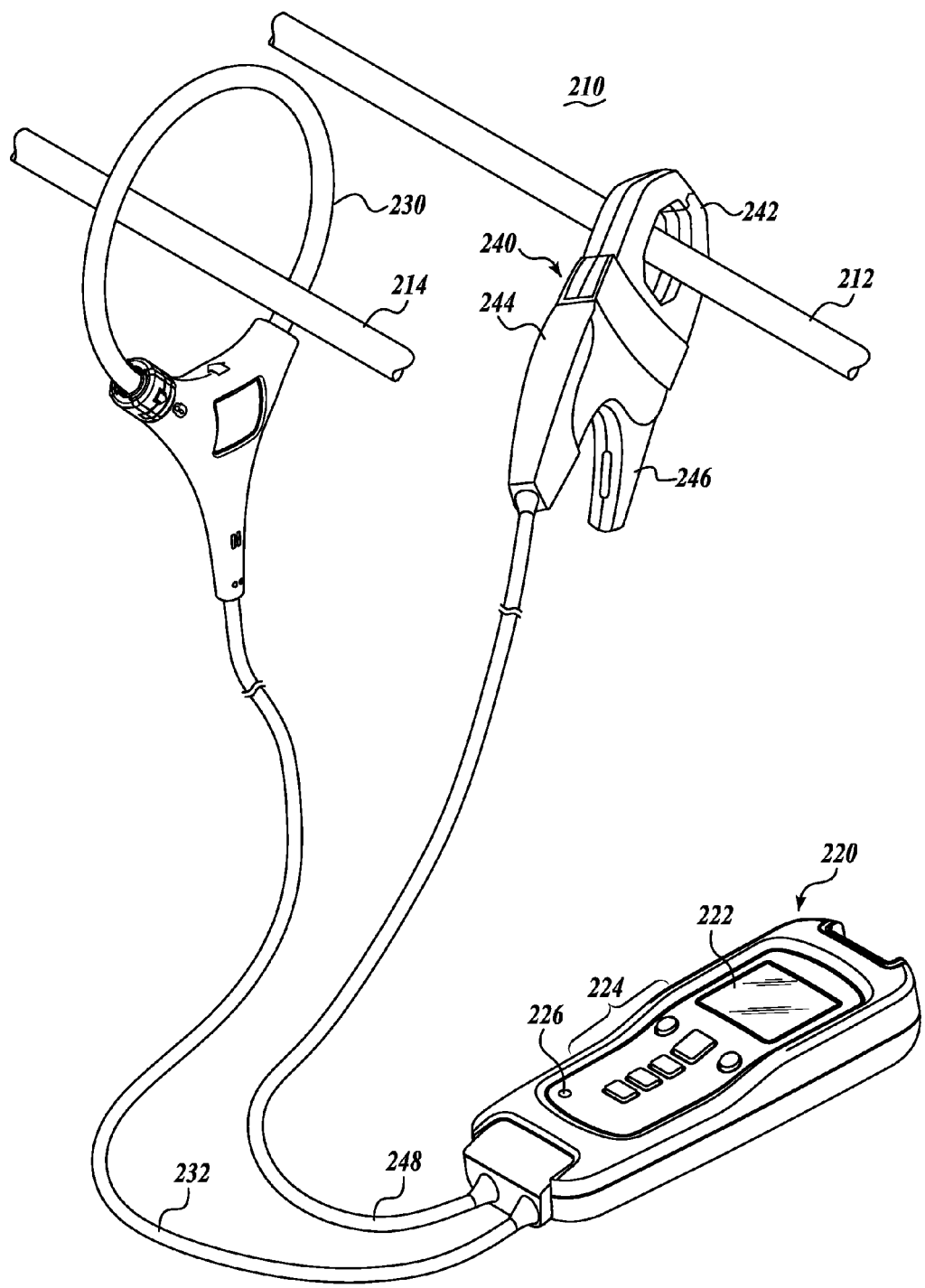

In the embodiment depicted in FIG. 2B, the electrical equipment area 210 includes the electrical conductor 212 and a second electrical conductor 214. The electrical conductor 212 and the second electrical conductor 214 may be coupled to each other or the electrical conductor 212 and the second electrical conductor 214 may be parts of different circuits within the electrical equipment area 210. The current clamp 240 is clamped around the electrical conductor 212 and induces a current from the current carried by the electrical conductor 212. The testing device 220 is powered by the current induced by the current clamp 240. In FIG. 2B, the sensor 230 is external to the testing device 220. The sensor 230 is in the form of a Rogowski coil located around the electrical conductor 214. The testing device 220 measures a characteristic relating to the electrical conductor 214 based on signals sent by the sensor 230 and transmits the measured data to a remote computing device (e.g., the monitoring station 120 shown in FIGS. 1A and 1B).

Figure 2C:
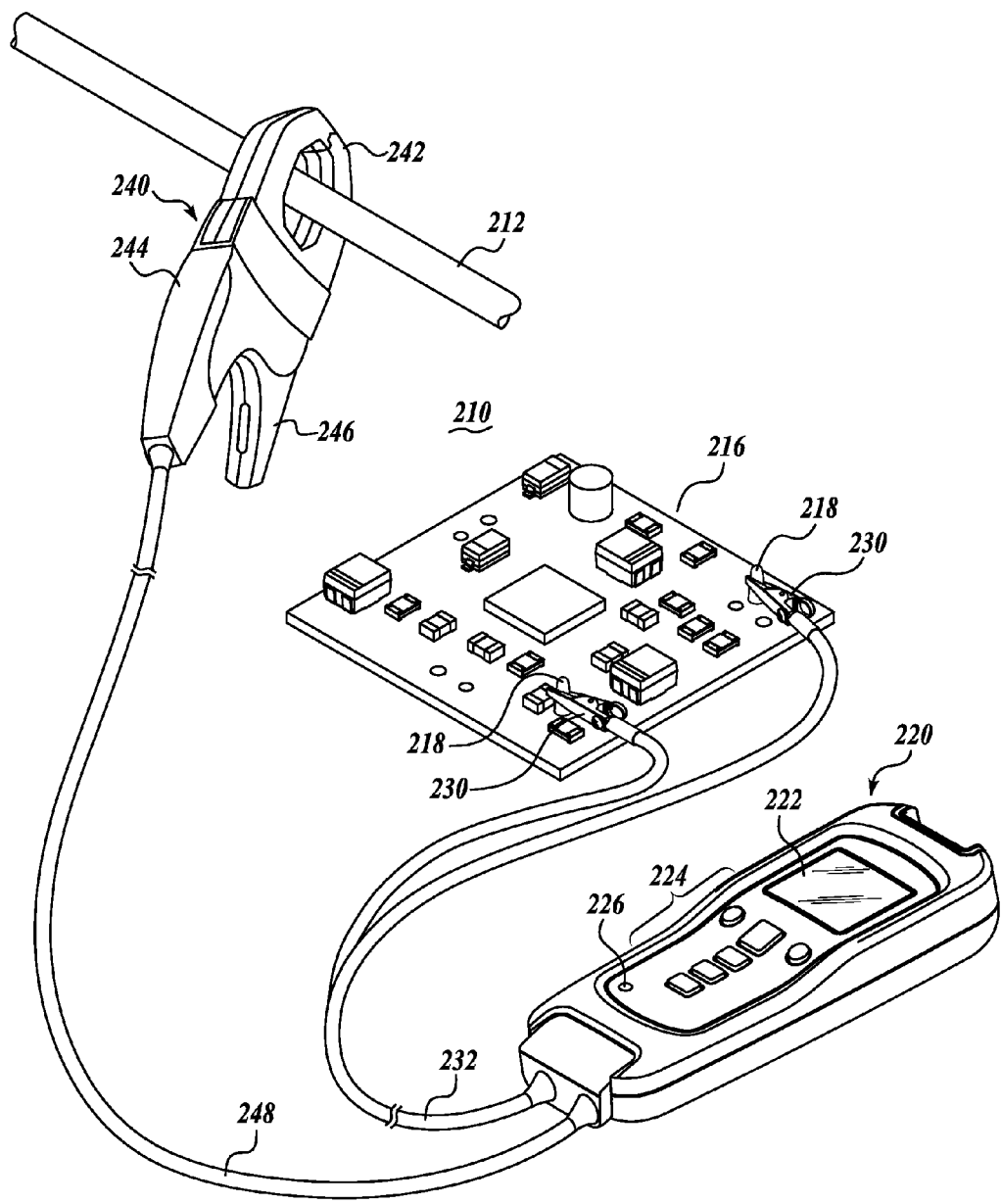

In the embodiment shown in FIG. 2C, the electrical equipment area 210 includes the electrical conductor 212 and equipment 216. The equipment 216 can be any type of equipment, such as a printed circuit board, a battery, a capacitor, a transformer, a motor, or any other type of equipment in the electrical equipment area 210. In the illustrated embodiment, the equipment 216 has leads 218. The current clamp 240 is clamped around the electrical conductor 212 and induces a current from the current carried by the electrical conductor 212. The testing device 220 is powered by the current induced by the current clamp 240. In FIG. 2C, the sensor 230 is external to the testing device 220. The sensor 230 includes connectors that connect to the leads 218 of equipment 216. The testing device 220 can measure any characteristic of the equipment 216 using the leads 218, such as a voltage difference across the leads 218, a resistance between the leads 218, and the like. The testing device 220 measures the characteristic relating to the equipment 216 and transmits the measured characteristic to a remote computing device.

Figure 2D:
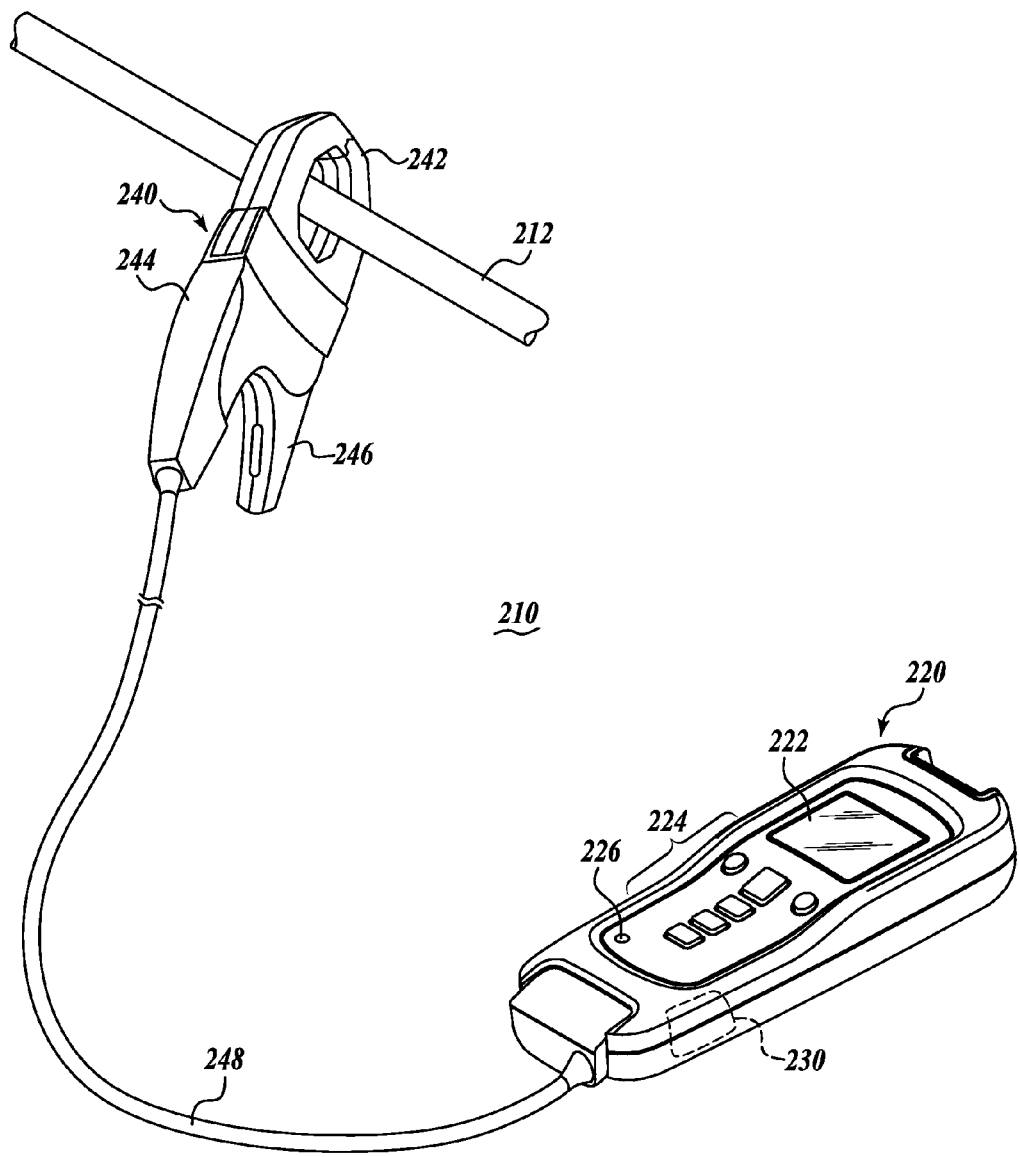

In the embodiment shown in FIG. 2D, the electrical equipment area 210 includes the electrical conductor 212. The current clamp 240 is clamped around the electrical conductor 212 and induces a current from the current carried by the electrical conductor 212. The testing device 220 is powered by the current induced by the current clamp 240. In FIG. 2D, the sensor 230 is internal to the testing device 220. The sensor 230 can be a pressure sensor (e.g., a piezoelectric sensor), a temperature sensor (e.g., a thermocouple), a humidity sensor (e.g., an electric hygrometer), or any other type of sensor. The sensor 230 sends a signal to the testing device 220 based on a characteristic within the electrical equipment area 210. The testing device 220 measures a characteristic relating to the electrical conductor 212, which may include the area 210 wherein the electrical conductor 212 is located, based on signals sent by the sensor 230 and transmits the measured data to a remote computing device.

Figure 3:
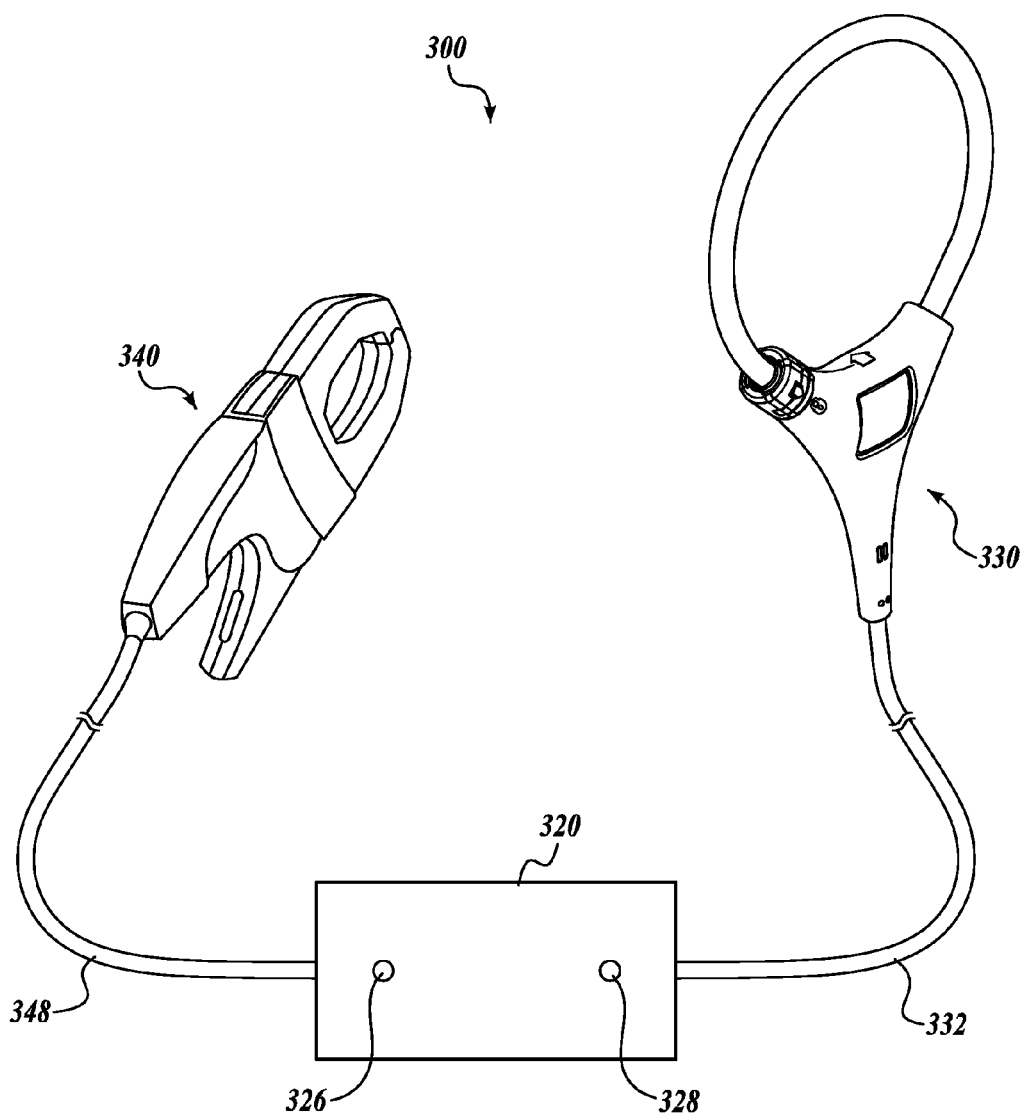
FIG. 3 depicts an embodiment of a system with a testing device that can be used in an electrical equipment area.

FIG. 3 depicts an embodiment of a system 300 with a testing device 320 that can be used in an area holding electrical equipment. The testing device 320 is coupled, via wiring 348, to a current clamp 340 that has a non-torroidal current transformer. The current clamp 340 can be placed around an electrical conductor in the area holding the electrical equipment and induce an electric current from the electrical conductor. The induced electric current can be converted to direct current and provided to the testing device 320 to power the testing device 320. The testing device 320 is also coupled to a sensor 330 via wiring 332. The testing device 320 can receive a signal from the sensor 330 indicative of a characteristic of the electrical equipment. The testing device 320 measures the characteristic of the electrical equipment based on signals sent by the sensor 330 and transmits the measured characteristic to a remote computing device.

The testing device 320 includes a first indicator 326 and a second indicator 328. In at least one embodiment, the first and second indicators 326 and 328 are lights, such as LEDs, that can be selectively illuminated. The first indicator 326 can be selectively illuminated when the testing device 320 is receiving power from the current clamp 340. The second indicator 328 can be selectively illuminated when the testing device 320 is properly measuring data and/or transmitting the measured data. The illumination of the first and second indicators 326 and 328 allow a user (e.g., someone installing the testing device 320 in the electrical equipment area) to see that the testing device 320 is properly powered and properly operating. In the embodiment shown in FIG. 3, the testing device 320 does not include a display. The cost of the testing device 320 is lower without a display, but the lack of a display may make the testing device 320 more difficult for a user to interact with the testing device 320. However, in the case where the testing device 320 is placed in an electrical equipment area and left unattended for long periods of time to measure and transmit data without user interaction, the lack of a display may not be a significant hindrance to use of the testing device 320 over most of its lifetime.

Figure 4A:
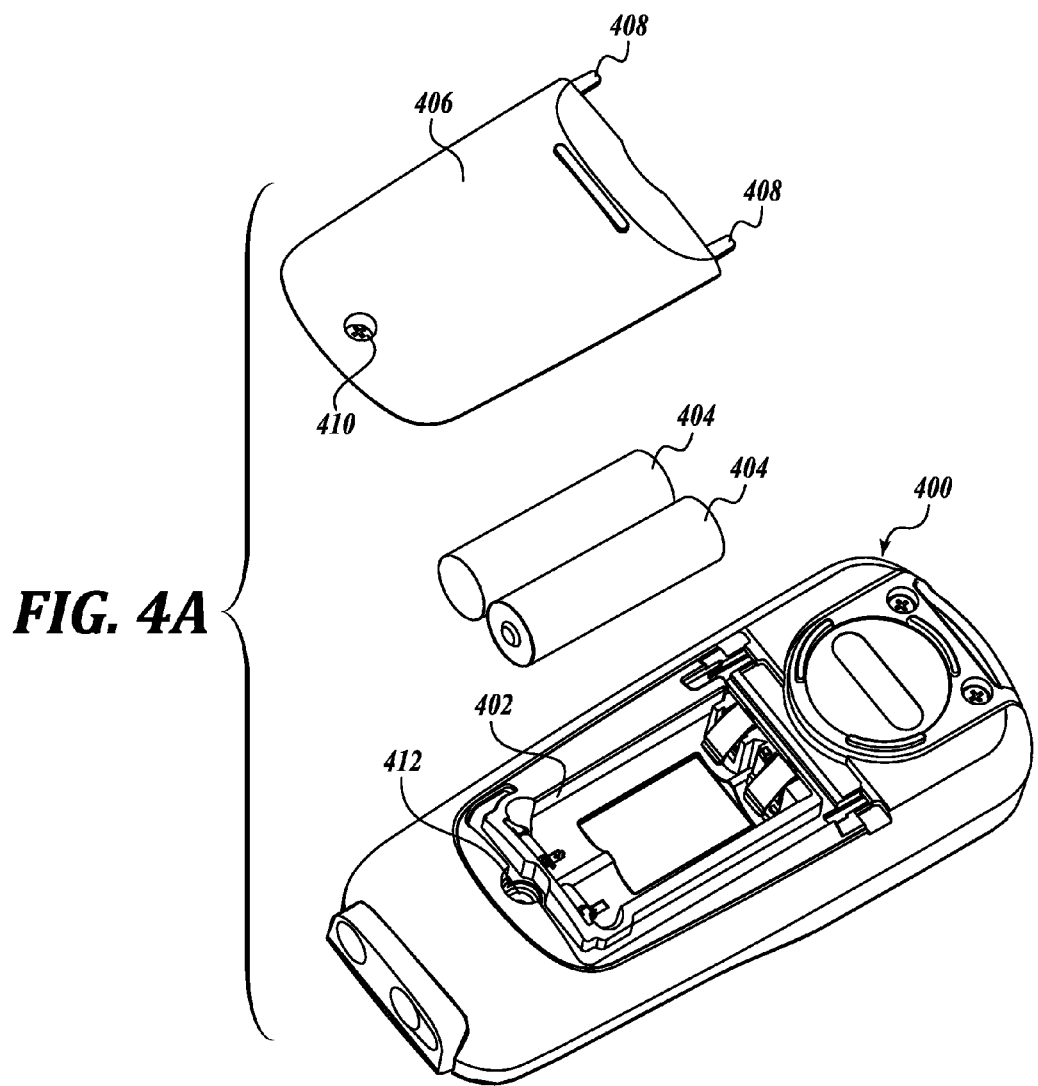
FIG. 4A depicts a rear view of an embodiment of a testing device and an associated battery compartment cover.

FIG. 4A depicts a rear view of an embodiment of a testing device 400 and an associated battery compartment cover 406. The testing device 400 includes a battery compartment 402 that accepts one or more batteries 404. The testing device 400 may have been designed as a stand-alone unit to operate on the power provided by the one or more batteries 404. The testing device 400 may have been provided with the battery compartment cover 406 that encloses the battery compartment 402 to protect the one or more batteries 404 during operation and to prevent the one or more batteries 404 from coming out of the battery compartment 402 during operation. The battery compartment cover 406 has connecting features that allow the battery compartment cover 406 to be secured to the battery compartment 402, including tabs 408 that can be inserted into slots (not shown) in battery compartment 402 and a screw 410 that can be secured into threaded hole 412. In other embodiments, the battery compartment cover 406 can have different connecting features, such as a spring clip, sliding tabs, and the like.

The testing device 400 can be operated under the power provided by the one or more batteries 404. However, as described above, using testing device 400 powered by the one or more batteries 404 alone may not be ideal in situations where the testing device 400 is left in an electrical equipment area for long periods of time. The one or more batteries 404 may store enough electrical energy to power the testing device 400 inside the electrical equipment area for only a few days or weeks. Once the one or more batteries 404 are depleted, a person would need to enter the electrical equipment area to replace the one or more batteries 404, potentially causing risk to the person entering the electrical equipment area, interruption of service of the electrical equipment area when the person is in the electrical equipment area, loss of labor of the person entering the electrical equipment area and anyone else that may need to assist in gaining access to the electrical equipment area, and the like.

Figure 4B:
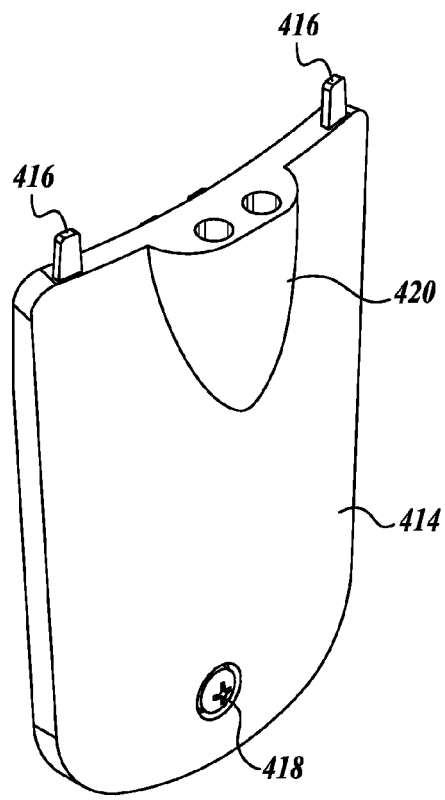
FIGS. 4B and 4C depict two perspective views of a replacement battery compartment cover that can be used with the testing device to allow the testing device to be powered by a current clamp.
Figure 4C:
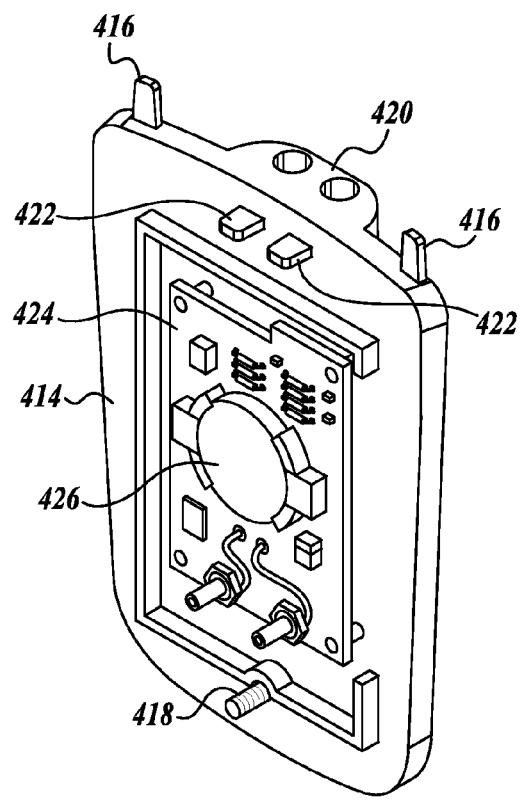

FIGS. 4B and 4C depict two perspective views of a replacement battery compartment cover 414 that can be used with the testing device 400 to replace the original battery compartment cover 406 to allow the testing device 400 to be powered by a current clamp. The battery compartment cover 414 includes connecting features that allow the battery compartment cover 414 to be secured to the battery compartment 402, including tabs 416 that can be inserted into slots (not shown) in battery compartment 402 and a screw 418 that can be secured into threaded hole 412. In other embodiments, the battery compartment cover 414 can have different connecting features, depending on the type of connecting features that the battery compartment 402 is designed to accept.

The battery compartment cover 414 also includes a connector 420. A current clamp can be coupled to the connector 420. The battery compartment cover 414 includes tabs 422 that contact terminals of the one or more batteries 404 in the battery compartment when the battery compartment cover 414 is secured to the battery compartment 402. When the connector 420 is coupled to a current clamp and the battery compartment cover 414 is secured to the battery compartment 402, electric current from the current clamp can be passed to the testing device 400 via the connector 420 and the tabs 422 to power the testing device 400. As described above, circuitry may convert the electric current induced by the current clamp into a direct current such that the testing device 400 is powered by the direct current. A portion or all of that circuitry may be provided in the battery compartment cover 414, such as in the connector 420. In the particular embodiment shown in FIG. 4C, the inside of the battery compartment cover 414 includes a printed circuit board 424 with a battery 426. The printed circuit board 424 can include a portion or all of the circuitry between a current clamp and the testing device 400. The battery 426 can replace the function of the original batteries 404 that were used with the testing device 400. Without the original batteries 404, the battery compartment 402 can provide sufficient room for the printed circuit board 424 and the battery 426 to be housed in the battery compartment 402 when the battery compartment cover 414 is secured to the battery compartment 402. In at least one embodiment, the battery 426 is a rechargeable battery. For example, the battery 426 can have improved recharge capabilities over the original batteries 404.

Although the battery compartment cover 414 may allow the testing device 400 to be powered by electric current provided by a current clamp, it may be advantageous to still provide the one or more batteries 404 in the battery compartment 402 as a supplemental power source. For example, the testing device 400 may draw a lower amount of current when receiving signals and measuring data (e.g., 4 mA) than it does when transmitting measured data (e.g., 60 mA). In some embodiments, the testing device 400 may continuously receive signals and measure data while powering a transmitter to send data only on a periodic basis. For example, the testing device 400 may power the transmitter to transmit data every 5 seconds for a duration of up to 300 milliseconds. During peak current draw times, the current clamp may not provide sufficient current to the testing device 400. Having the one or more batteries 404 in the battery compartment 402 as a supplemental power source will ensure that the testing device 400 will be able to draw sufficient current even at peak draw times. In at least one embodiment, the one or more batteries 404 are rechargeable batteries that can be charged by current provided by the current clamp. The one or more batteries 404 can be recharged by any current from the current clamp that is not drawn by the testing device 400 and the testing device 400 can draw current from the one or more batteries 404 when the current from the current clamp is insufficient to satisfy the needs of the testing device 400.

For users that own a testing device 400 with an original battery compartment cover 406, the ability to purchase a replacement battery compartment cover 414 that connects to a current clamp may allow the users to connect the testing device 400 to a current clamp without needing to replace the entire testing device 400. Thus, users upgrading existing testing devices 400 can save money by purchasing a replacement battery compartment cover 414 instead of purchasing a new testing device 400. However, in other embodiments, testing devices may be manufactured in a way that they are ready to receive power from a current clamp, such as having current clamp connectors integrated into a housing of the testing device and connected to circuitry inside the housing of the testing device.

Figure 5:
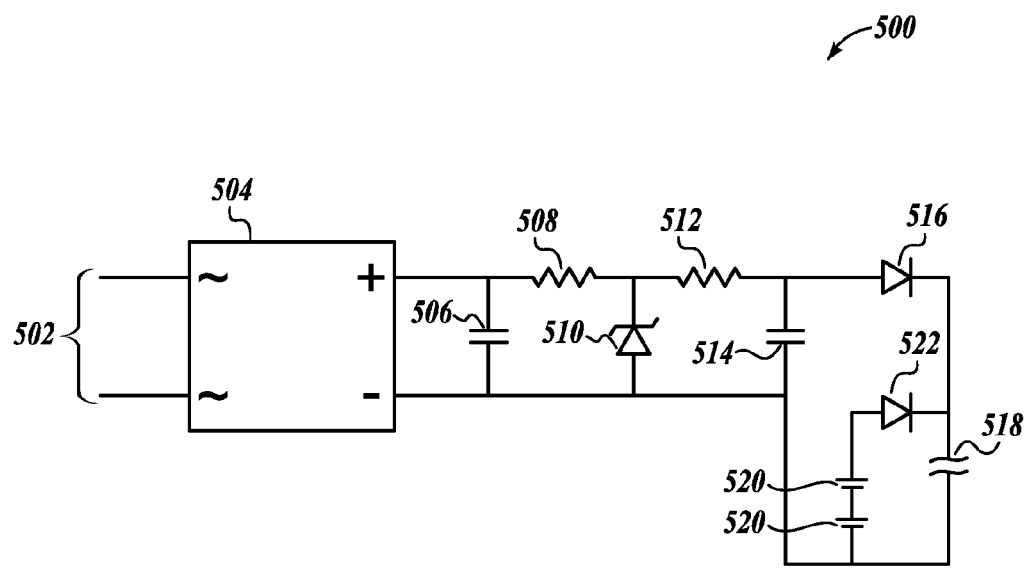
FIG. 5 depicts an example of circuitry that can convert current induced by a current transformer of a current clamp into direct current to power a testing device.

FIG. 5 depicts an example of circuitry 500 that can convert current induced by a current transformer of a current clamp into direct current to power a testing device. Induced alternating current received at inputs 502 are provided to a rectifier 504 that rectifies the alternating current. The circuitry 500 includes a first capacitor 506 and a first resistor 508 configured to provide smoothing of the rectified signal from the rectifier 504. The circuitry 500 also includes a Zener diode 510 that clamps voltage exceeding a particular level. The Zener diode 510 ensures that the testing device does not receive electrical energy at a voltage that exceeds the particular level. The circuitry 500 also includes a second capacitor 514 and a second resistor 512 configured to smooth the clamped voltage signal that passes the Zener diode 510.

The circuitry 500 includes a first diode 516 that permits passage of the smoothed current from the second capacitor 514 and the second resistor 512 to the testing device power inlet 518. The circuitry 500 also includes one or more batteries 520, which may be one or more batteries located inside of a battery compartment of the testing device. The circuitry 500 also includes a second diode 522 that permits passage of current from the one or more batteries 520 to the testing device power inlet 518. The combined operation of the first and second diodes 516 and 522 causes current to be selectively provided to the testing device power inlet 518 from either the converted current induced from the current clamp or the current available from the one or more batteries based on whether the voltage of the converted current induced from the current clamp is greater than or less than the current available from the one or more batteries.

In other embodiments not shown in FIG. 5, the converted current induced from the current clamp may be used for one or both of powering the testing device power inlet 518 or recharging the one or more batteries 520. For example, the circuitry 500 may include an integrated circuit configured to determine whether the converted current induced from the current clamp can be used to power the testing device power inlet 518 and/or recharging the one or more batteries 520. The integrated circuit may direct the entire converted current induced from the current clamp to power the testing device power inlet 518, direct the entire converted current induced from the current clamp to recharge the one or more batteries 520, and/or simultaneously direct one portion of the converted current induced from the current clamp to power the testing device power inlet 518 and another portion of the converted current induced from the current clamp to recharge the one or more batteries 520.

As discussed above, potions of the circuitry 500 depicted in FIG. 5 can be provided in one or more of a current clamp, wiring between the current clamp and the testing device, a connector or battery compartment cover of the testing device, or the testing device. The circuitry 500 depicted in FIG. 5 is one embodiment of circuitry that converts electric current induced by a current transformer of a current clamp into direct current to power a testing device. However, many other embodiments of circuitry may also be used to convert electric current induced by a current transformer of a current clamp into direct current to power a testing device.

In another embodiment, the circuitry 500 can be configured to sense the incoming induced alternating current from the current clamp. The circuitry 500 can be configured to determine whether the incoming current from the current clamp is at a level suitable to rectify to direct current. The circuitry may also include a transformer. In the event that the circuitry 500 determines that the incoming current from the current clamp is not at a level suitable to rectify to direct current, the circuitry 500 can use the transformer to adjust the incoming alternating current prior to providing the incoming alternating current to the rectifier 504. In this way, any number of current clamps can be coupled to the circuitry 500, and the circuitry 500 can adjust to different alternating currents from different current clamps.

While the present application has been illustrated and described in detail in the drawings and foregoing description, such illustration and description are to be considered illustrative or exemplary and not restrictive. The present disclosure is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope. The scope and spirit of the present application is defined by the appended claims.

The embodiments of the invention in which an exclusive property or privilege is claimed are defined as follows:

1. A system, comprising:
   a testing device configured to measure a characteristic relating to electrical equipment and to transmit data representing the measured characteristic to a remote computing device, wherein the testing device comprises one or more batteries that are usable to power the testing device, and wherein electrical equipment includes an electrical conductor carrying an electric current;
   a current clamp forming a current transformer, wherein the current clamp is configured to be clamped around the electrical conductor, and wherein the current transformer is configured to induce an electric current from the electrical conductor; and
   circuitry configured to convert the induced electric current to a direct current that is usable to power the testing device, wherein the circuitry provides power to the testing device from one of the direct current and the one or more batteries based on a voltage of the direct current and a voltage of the one or more batteries.

2. The system of claim 1, further comprising:
   a sensor configured to produce a signal based on the characteristic of the electrical equipment.

3. The system of claim 2, wherein the characteristic is an electrical characteristic of at least a portion of the electrical equipment.

4. The system of claim 3, wherein the portion of the electrical equipment includes the electrical conductor.

5. The system of claim 3, wherein the portion of the electrical equipment does not include the electrical conductor.

6. The system of claim 2, wherein the characteristic is an environmental characteristic of the electrical equipment or an area holding the electrical equipment.

7. The system of claim 2, wherein the sensor is external to and coupled to the testing device.

8. The system of claim 2, wherein the sensor is internal to the testing device.

9. The system of claim 1, wherein the circuitry comprises diodes arranged to provide power to the testing device from one of the direct current and the one or more batteries based on the higher of the voltage of the direct current and the voltage of the one or more batteries.

10. The system of claim 1, wherein the testing device comprises a battery compartment configured to hold the one or more batteries and a battery compartment cover, and wherein the battery compartment cover comprises a connector configured to electrically couple the current clamp to the testing device.

11. The system of claim 10, wherein at least a portion of the circuitry is located on the battery compartment cover.

12. The system of claim 1, wherein the circuitry is configured to recharge the one or more batteries using the direct current.

13. The system of claim 12, wherein the circuitry is configured to simultaneously recharge the one or more batteries and power the testing device using the direct current.

14. The system of claim 1, further comprising:
   an indicator configured to indicate whether the current clamp is inducing an electric current from the electrical conductor.

15. The system of claim 14, wherein the indicator comprises at least one of a light on the current clamp, a light on the testing device, or an icon on a display of the testing device.

16. The system of claim 1, wherein a size of the current clamp is determined based on a size of the electrical conductor.

17. The system of claim 1, wherein the electric current induced from the electrical conductor is equal to or less than 1% of the electric current carried by the electrical conductor.

18. The system of claim 1, wherein the electric current carried by the electrical conductor is greater than a maximum current rating of the testing device.

19. The system of claim 1, wherein the testing device is further configured to transmit the data representing the measured characteristic to the remote computing device via at least a wireless signal.

20. The system of claim 1, wherein the current transformer is a non-torroidal current transformer.

21. A system, comprising:
   a testing device configured to measure a characteristic relating to electrical equipment and to transmit data representing the measured characteristic to a remote computing device, wherein the testing device comprises one or more batteries that are usable to power the testing device, a battery compartment configured to hold the one or more batteries, and a battery compartment cover, and wherein electrical equipment includes an electrical conductor carrying an electric current;
   a current clamp forming a current transformer, wherein the current clamp is configured to be clamped around the electrical conductor, and wherein the current transformer is configured to induce an electric current from the electrical conductor; and
   circuitry configured to convert the induced electric current to a direct current that is usable to power the testing device,
   wherein the battery compartment cover comprises a connector configured to electrically couple the current clamp to the testing device.

22. The system of claim 21, wherein at least a portion of the circuitry is located on the battery compartment cover.

23. A system, comprising:
- a testing device configured to measure a characteristic relating to electrical equipment and to transmit data representing the measured characteristic to a remote computing device, wherein the testing device comprises one or more batteries that are usable to power the testing device, and wherein electrical equipment includes an electrical conductor carrying an electric current;
- a current clamp forming a current transformer, wherein the current clamp is configured to be clamped around the electrical conductor, and wherein the current transformer is configured to induce an electric current from the electrical conductor; and
- circuitry configured to convert the induced electric current to a direct current that is usable to power the testing device, wherein the circuitry is configured to recharge the one or more batteries using the direct current.

24. The system of claim 23, wherein the circuitry is configured to simultaneously recharge the one or more batteries and power the testing device using the direct current.

\* \* \* \* \*